(12) United States Patent
Grabowski et al.

(10) Patent No.: US 9,768,274 B2
(45) Date of Patent: Sep. 19, 2017

(54) LATERALLY-GRADED DOPING OF MATERIALS

(71) Applicant: Power Integrations, Inc., San Jose, CA (US)

(72) Inventors: Wayne B. Grabowski, Los Altos, CA (US); Kuo-Chang Yang, Campbell, CA (US); Kamal Raj Varadarajan, Santa Clara, CA (US); Sujit Banerjee, Round Rock, TX (US); Vijay Parthasarathy, Sunnyvale, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 14/685,243

(22) Filed: Apr. 13, 2015

(65) Prior Publication Data
US 2016/0149018 A1 May 26, 2016

Related U.S. Application Data

(60) Provisional application No. 62/084,520, filed on Nov. 25, 2014.

(51) Int. Cl.
| | |
|---|---|
| H01L 29/66 | (2006.01) |
| H01L 21/266 | (2006.01) |
| H01L 21/265 | (2006.01) |
| H01L 21/225 | (2006.01) |
| H01L 29/40 | (2006.01) |
| H01L 29/78 | (2006.01) |
| H01L 29/06 | (2006.01) |
| H01L 29/08 | (2006.01) |

(52) U.S. Cl.
CPC .... *H01L 29/66659* (2013.01); *H01L 21/2251* (2013.01); *H01L 21/2253* (2013.01); *H01L 21/266* (2013.01); *H01L 21/26513* (2013.01); *H01L 29/0634* (2013.01); *H01L 29/0847* (2013.01); *H01L 29/404* (2013.01); *H01L 29/7835* (2013.01)

(58) Field of Classification Search
None
See application file for complete search history.

(56) References Cited

U.S. PATENT DOCUMENTS

| | | | |
|---|---|---|---|
| 5,726,469 A | 3/1998 | Chen | |
| 2013/0049114 A1* | 2/2013 | Wang | H01L 21/266 257/339 |
| 2014/0061788 A1* | 3/2014 | Chen | H01L 29/7816 257/339 |
| 2016/0181437 A1* | 6/2016 | Bu | H01L 21/28 257/66 |

* cited by examiner

*Primary Examiner* — Reema Patel
*Assistant Examiner* — Steven Christopher
(74) *Attorney, Agent, or Firm* — Christensen O'Connor Johnson Kindness PLLC

(57) ABSTRACT

A method includes defining, on a surface of a material, a plurality of discrete portions of a surface as surface elements having at least one of a laterally-varying size, a laterally-varying shape, and a laterally-varying spacing. A plurality of portions of the material beneath the surface elements are doped with a single quantity of dopant material per element area. The dopant material within the material beneath the surface elements expands to provide a lateral gradient of dopant material in the material beneath the surface elements.

13 Claims, 9 Drawing Sheets

An Example of a Halftoned cell that shows ~25% density in Drain area (left side), grading linearly to ~16.5%, 12.5% and eventually to 6% near the Source (right edge).

LATERALLY-GRADED DOPING OF MATERIALS

REFERENCE TO RELATED APPLICATION

This application claims the benefit of U.S. Provisional Application No. 62/084,520, filed Nov. 25, 2014.

BACKGROUND INFORMATION

Field of the Disclosure

The present disclosure relates generally to laterally-graded doping of materials, such as semiconductors.

Background

Materials can be doped with impurities to imbue them with desired properties. For example, the electrical conductivity of intrinsic single crystal silicon can be increased by introducing impurities that increase the number of charge carriers (i.e., electrons or holes) in the crystal lattice. In this case, impurities that increase the number of electrons are referred to as n-type dopants whereas impurities that increase the number of holes are referred to as p-type dopants.

It is often convenient to introduce impurities into materials using laterally-resolved techniques in which a selected region of a larger bulk is selectively doped by impurities (or other species) that have traversed a selected portion of a larger surface. The dopant concentration will be relatively higher in the regions immediately beneath the selected portion of the larger surface whereas the dopant concentration will be relatively lower or even zero in regions that are laterally removed from the selected portion. Examples of techniques in which dopants traverse a surface include diffusion and implantation. In such techniques, the selected portion of the larger surface can be defined using, e.g., masking techniques, beam focusing, and/or combinations of these and other techniques.

Despite the widespread adoption of these techniques, it remains problematic to laterally-grade the doping of materials to achieve desired properties. For example, although a dopant that traverses a material surface through an opening in a mask may diffuse both vertically and laterally away from the opening into the material (thus producing both a vertical and lateral doping gradients), these gradients are constrained by the physical properties of the dopant/material system. The ability of designers to achieve a particular lateral doping gradient is impaired.

One class of devices that would benefit from an improved ability to achieve lateral doping gradients that are not constrained by the physical properties of the dopant/material system is semiconductor devices (e.g., power MOSFETs, BJTs, JFETs, IGFETs, resistors, etc.). For instance, in many high voltage switching devices, on-resistance ($R_{dson}$) and breakdown voltage ($V_{BV}$) are often competing design considerations. For example, both on-resistance ($R_{dson}$) and breakdown voltage ($V_{BV}$) generally decrease with decreasing length of the drift region. Optimizing a switching device for one necessarily impairs the other.

In the past, buried layers that deplete multiple conduction channels in the off-state have been used to improve the breakdown voltage despite the presence of multiple channels. Also, in vertical devices, vertically-graded doping in the drift region has been used to improve $R_{dson}$ without unduly impairing $V_{BV}$.

SUMMARY

A new process for laterally-graded doping of materials is described. This process can be used with a variety of materials (including, e.g., semiconductors) to achieve lateral doping gradients that are not constrained by the physical properties of the dopant/material system. Although advantageous in many contexts, in the context of high voltage switching devices, higher quality lateral devices can be produced by balancing the competing design considerations of breakdown voltage and on-state resistance using such lateral doping gradients. Indeed, in some instances, the new process can be used to create—on a single wafer—structures and devices (transistors, resistors, etc.) having a variety of lateral dopant gradients using a single masking and impurity introduction step.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
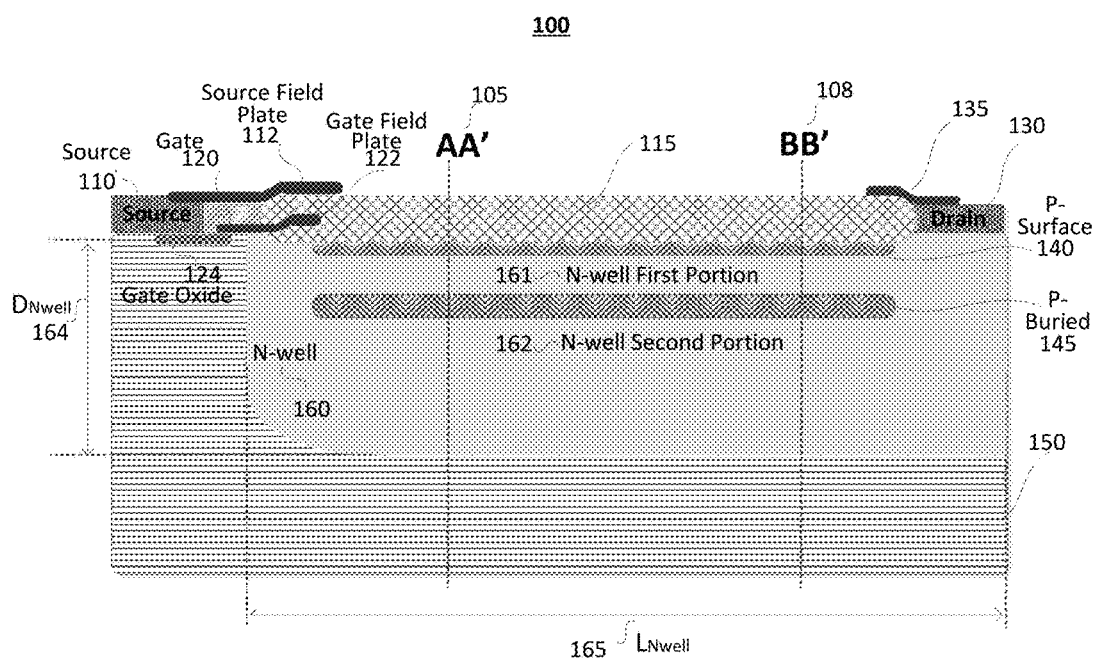
FIG. 1 is a schematic representation of an example of a lateral switching device (vertical cross section) in which a laterally graded doping concentration is present.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In this application, different techniques are described for laterally-graded doping of materials. The lateral doping gradients are not constrained by the physical properties of the dopant/material system. This is useful in many contexts. For example, in high voltage switching devices, lateral devices in which the concentration of dopant in drift region varies spatially in two dimensions (laterally) can be formed. The lateral special variation of the dopant concentration in drift region can be used to balance the trade-offs between breakdown voltage and specific on-resistance of the high voltage device.

Different implementations for laterally-graded doping in either one or two lateral dimensions are described. In some implementations, stripes with different predefined widths of openings and pitches are applied. The stripes may either be rectangular shape with gradual step change of the openings or trapezoidal with a continuous change of the opening width. The stripes allow the doping to be laterally graded.

In other implementations, a doping process uses a halftoning process similar to that used in photo pixel shading. These implementations allow a finer distribution and control of the dopant concentration gradient.

The special variation of the drift region doping may be used to tailor the breakdown voltage and specific on-resistance of high voltage devices (e.g., MOS transistors, BJTs, JFETs, resistors, and/or other devices). The laterally-graded doping is compatible with existing process flows to create high voltage devices and can be implemented by a single or multiple masking and dopant-introduction steps.

FIG. 1 is a schematic representation of a vertical cross-section of an example lateral switching device in which a laterally graded doping concentration is present. In the illustrated implementation, the lateral switching device is a lateral MOSFET 100 in which the concentration of the diffused dopant increases laterally from source toward the drain in a drift region. Lateral MOSFET 100 includes a source 110, a gate 120, and a drain 130 that are defined above a substrate 150. Gate 120 controls the conduction of current between source 110 and drain 120. In MOSFET 100, the conduction path between source 110 and drain 130 includes both a first portion and a second portion. The first portion can be referred to as an "IGFET channel" or a "MOSFET channel" and is disposed beneath gate 120 and an intervening gate oxide 124. The second portion can be referred to as a "drift region" or a "JFET channel" and, in the illustrated implementation, is formed by two laterally-extending N-regions (161 and 162) within N-well 160. In particular, the first laterally extending N-region 161 is disposed between a first laterally extending P-doped region (i.e., P-surface region 140) adjacent to the surface and a second laterally extending P-doped region (i.e., P-buried region 145) that is buried within N-well 160. The second laterally extending N-region 162 is disposed between region 145 and a P-doped portion of substrate 150. Regions 140, 145, and substrate 150 will together deplete N-regions 161 and 162 under certain bias conditions.

In the illustrated MOSFET 100, source 110 is coupled to a source field plate 112 that reduces the magnitude of the electric field in vicinity of source 110. In the illustrated MOSFET 100, gate 120 is disposed relatively close to source 110 and is coupled to a gate field plate 122. Drain 130 is laterally isolated from source 110 by a layer 115 on the surface. In the illustrated MOSFET 100, drain 130 is coupled to a drain field plate 135.

During operation, a high voltage can be applied between drain 130 and source 110 when MOSFET 100 is in the off state. The accompanying electric field is relatively high in the vicinity of drain 130, source 110, and gate 120. Most commonly, the drain terminal is coupled to a high voltage node and the maximum electric field is found in the neighborhood of drain 130. This high electric field value generates a weak point for partial electrical discharge and local breakdown. In some cases, this may result in a major breakdown (full collapse) between drain 130 and source 110.

A laterally-varying dopant concentration within the drift region can be used to reshape the electric field and provide a more uniform field distribution. A laterally-graded doping concentration can be used in isolation or in combination with other techniques used to shape electric fields, including, e.g., electrode field plates or buried field plates. As shown in graph of FIG. 2A the lateral doping concentration in N-well at cross section BB' 108 could differ from the N-well lateral doping concentration at cross section AA' 105. In one example the lateral doping concentration at the neighborhood of drain, cross section BB' 108, may be higher than the lateral doping concentration at source side, cross section AA' 105. Such a laterally varying dopant distribution in the drift region would thus improve performance by increasing the breakdown voltage and reducing the on resistance of the device relative to a device having a uniform dopant distribution in the drift region.

Figure 2A:
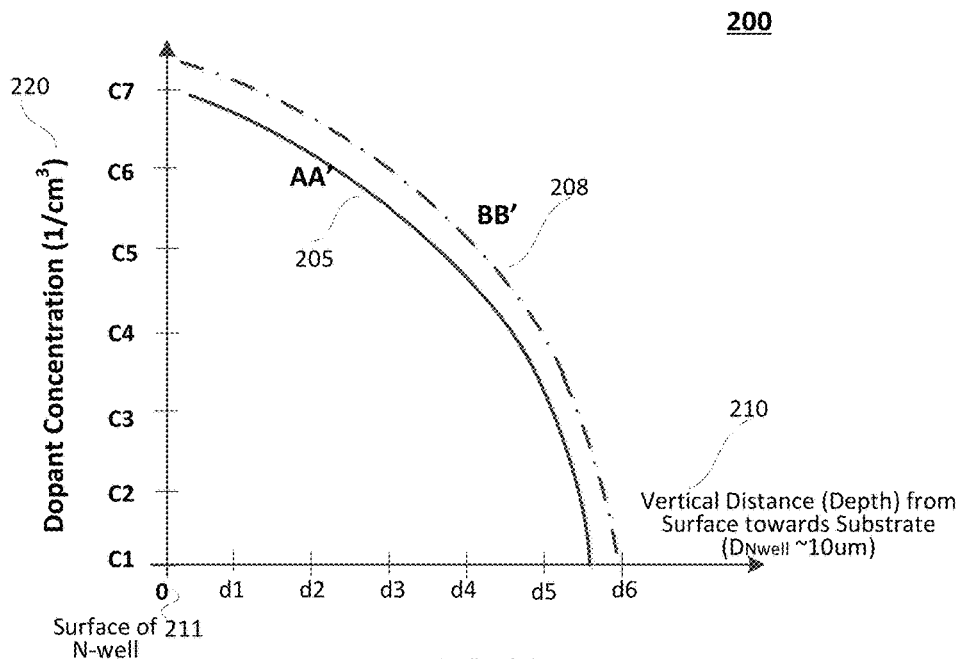
FIG. 2A is a graph illustrating the variation of dopant concentration versus vertical distance from the surface through which it has been diffused.

FIG. 2A is a graph 200 illustrating the variation of dopant concentration versus vertical distance from the surface through which the dopant has been diffused. Graph 200 includes a horizontal axis 210 and a vertical axis 220. Position along horizontal axis 210 indicates vertical distance (i.e., depth) from the surface of a device downward. Positions along horizontal axis 210 are demarcated by labels d1, d2, d3, . . . . Position along vertical axis 220 indicates the doping concentration per cubic centimeter ($1/cm^3$). Concentrations along vertical axis 220 are demarcated by labels c1, c2, c3, . . . . In implementations such as MOSFET 100 (FIG. 1), position 211 represents the top surface of N-well 160 and the depth of N-well 160 (i.e., $D_{Nwell}$ 164 in FIG. 1) can in one example be around 10 um.

Curves AA' 205 and BB' 208 represent the diffused dopant concentration as a function of depth from surface for two different cross sections. The first is taken along the cutline AA' (FIG. 1) and is closer to source 110. The second is taken along the cutline BB' (FIG. 2) and is closer to drain 130. Graphs AA' 205 and BB' 208 show a non-linear drop of the dopant concentration in the vertical direction. The dopant concentration along BB' closer to drain 130 is higher than the dopant concentration along AA' closer to source 110.

Figure 2B:
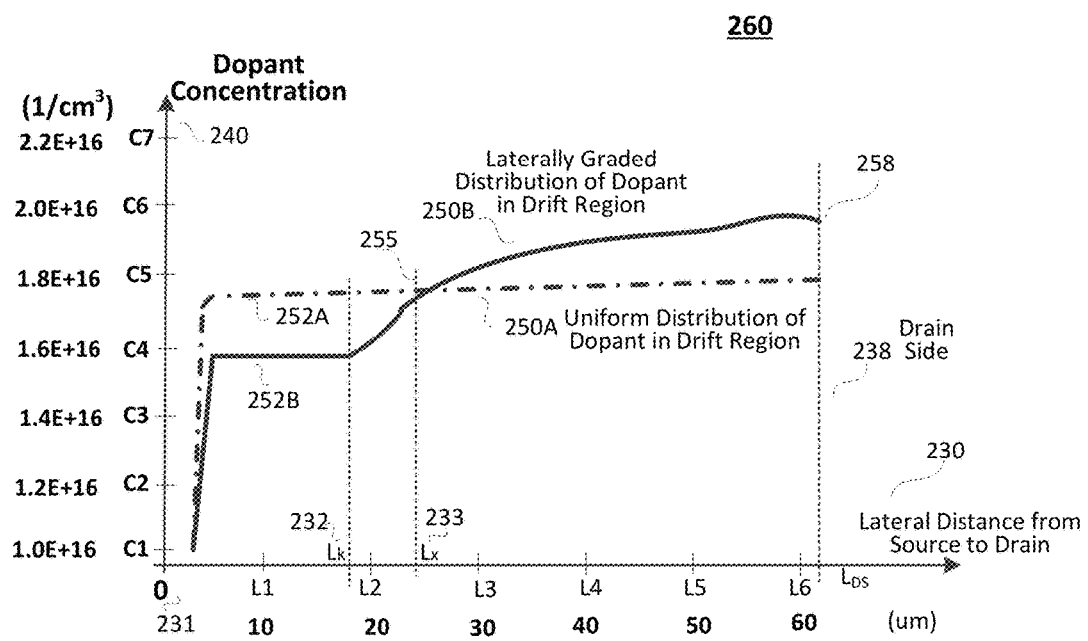
FIG. 2B is a schematic example of lateral doping distribution versus lateral distance (i.e., between source and drain) for an example lateral doping gradient that is not constrained by the physical properties of the dopant/material system. The doping concentration is expressed per cubic centimeter, $1/cm^3$, and distance is expressed in micrometers, um. Also illustrated is the doping of a device that has a lateral doping gradient that is constrained by the physical properties of the dopant/material system.

FIG. 2B is an example graph 260 of doping distribution versus lateral distance (i.e., between source and drain) for example devices, one of which includes a laterally-graded doping gradient that is not constrained by the physical properties of the dopant/material system. Graph 260 includes a horizontal axis 230 and a vertical axis 240. Position along horizontal axis 230 indicates lateral distance between the source and the drain of a device. Positions along horizontal axis 240 are demarcated by labels L1, L2, L3, . . . . Position along vertical axis 240 indicates the doping concentration per cubic centimeter ($1/cm^3$). Concentrations along vertical axis 240 are demarcated by labels C1, C2, C3, . . . . Example numerical values of doping concentration per cubic centimeter are included along the vertical axis 240. In implementations such as MOSFET 100 (FIG. 1), zero position 231 represents the represents the source side of the N-well (i.e., directly beneath gate 120 FIG. 1). In the illustrated implementation, the lateral distance along the N-well (e.g., $L_{Nwell}$ length 165 in FIG. 1) is around 65 um.

Graph 260 includes a solid line curve 250B and a broken line-dot graph 250A. Solid line curve 250B represents the doping concentration versus lateral distance for a device that includes a laterally-graded dopant concentration in the drift region. Broken line-dot graph 250A represents the doping concentration versus lateral distance for a device that includes a generally uniform lateral concentration of dopant in drift region. For both curves 250A and 250B near the source side of the respective device, the dopant concentration sharply increases from nearly zero to a relatively higher uniform level (252A or 252B) moving toward the drain. At a lateral position $L_k$ 232 from the source, the distribution trend of dopant concentration differs in curves 250A, 250B. For the example device with a generally uniform dopant concentration in drift region (i.e., the device represented by broken line-dot curve 250A), the dopant concentration remains generally unchanged along the drift region at any lateral position between the position $L_k$ 232 and the drain.

For the example device with a laterally-graded dopant concentration in the drift region (i.e., the device represented by solid curve 250B), a flat plateau level 252B in the vicinity of the source side of the N-well (i.e., to the left of $L_k$ 232) is lower than the dopant concentration of the device with a generally uniform dopant concentration in the same locations. However, on the source side of position $L_k$ 232, the dopant concentration in the device increases with distance from the source. The particular increase per unit length and dopant concentrations can be chosen to achieve desired device characteristics. At a position Lx 233 from the source (a so-called "cross point 255"), the dopant concentration of the device with a laterally-graded dopant concentration is above the dopant concentration of the device with the generally uniform dopant concentration. The dopant concentration of the device with a laterally-graded dopant concentration reaches a maximum level 258 at drain edge 238.

The integrated concentration of dopant in such a drift region is an important parameter in defining performance and breakdown voltage of device. For the sake of a meaningful comparison of the performance of the two example devices represented by 250A and 250B, the integrated dopant concentration in their drift regions should be the same. In other words, the area under the two graphs 250A and 250B should be the same for a meaningful comparison of the performance of the devices.

Figure 3A:
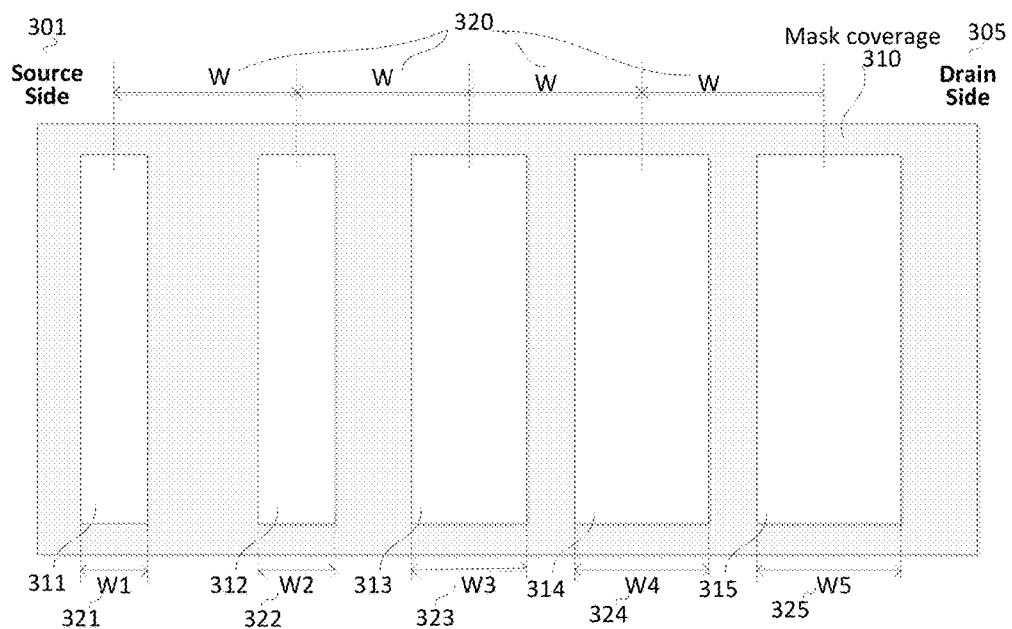
FIG. 3A is a schematic illustration of an example of a doping mask with generally rectangular stripe openings. The width of the generally rectangular shape stripe increases (W5>W4>W3>W2>W1) towards the drain to allow higher dopant concentration around the drain.
Figure 3B:
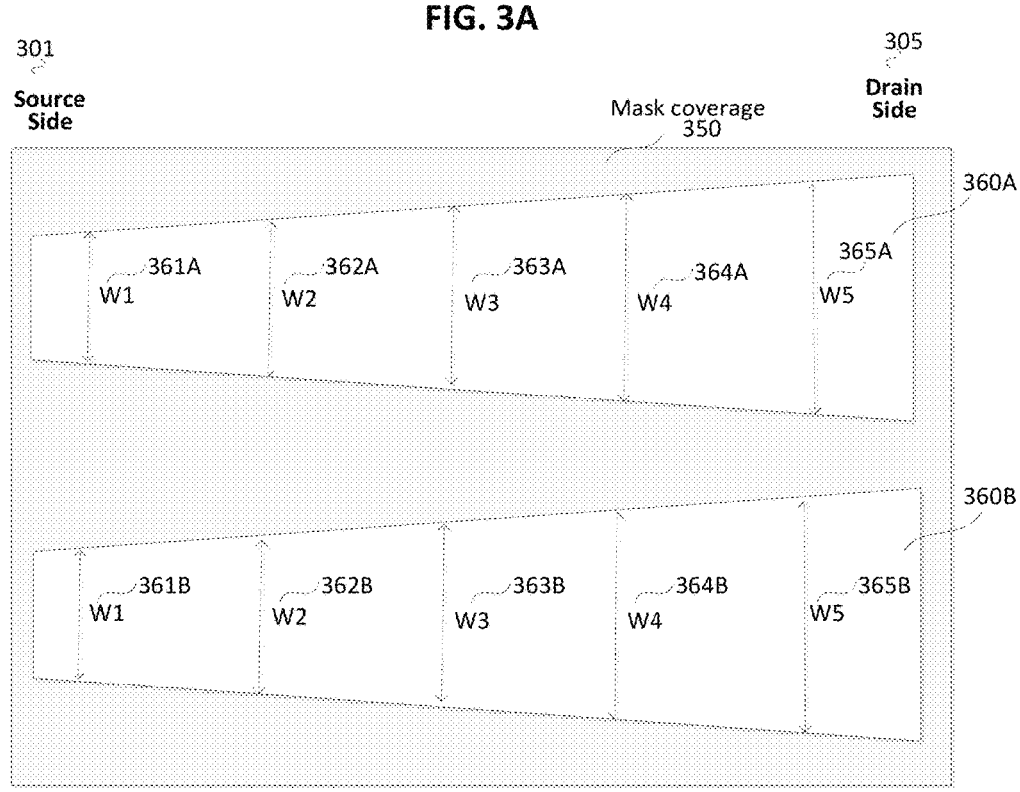
FIG. 3B is a schematic illustration of another embodiment example of doping mask with generally trapezoidal stripes. In this embodiment, the width of each opening continuously increases from W1 at the source side to W5 at the drain.

FIGS. 3A and 3B are schematic representations of two doping masks that can be used to laterally-grade dopant concentration using, e.g., an implantation or diffusion process.

FIG. 3A is a schematic illustration of an example of a doping mask with generally rectangular stripe openings. The lateral width of the generally rectangular stripes may be relatively smaller in the vicinity of the source and relatively larger in the vicinity of the drain. When such a mask is used in an implantation or diffusion process, the dopant diffusion per unit area in each section increases in steps with dopant concentration around the drain being higher than around the source. In some implementations, the pitch between the stripe openings (i.e., W 320) may be kept uniform. In one example, the mask coverage 310 has generally rectangular stripe openings 311, 312, 313, 314 and 315 with widths W1 321, W2 322, W3 323, W4 324 and W5 325, respectively. The width of each stripe closer to drain 305 is larger than the width of each stripe closer to source 301 (i.e., W5>W4>W3>W2>W1). Wider stripes allow dopant to traverse a larger surface area and dope a larger surface area of the underlying material. When this area is considered in conjunction with the surface area where such direct doping does not occur (i.e., the masked surface area), the dopant concentration per area appears to increase in a step-wise fashion across the drift region. In some implementations, the pitch of the stripe openings W 320 can be kept constant and the steps can approximate a staircase with uniform step size. In other implementations, a laterally-graded dopant distribution in the drift region can be achieved with generally rectangular stripe openings of equal width but spaced at a variable pitch.

FIG. 3B is a schematic illustration of an example of a doping mask with generally trapezoidal stripes. In this embodiment, the width of each opening is larger at positions closer to the drain than at positions closer to the source. In the illustrated implementation, mask openings 360A and 360B in the mask coverage 350 have identical generally trapezoidal shapes and dimensions. Each of source side widths (i.e., W1 361A/B, W2 362A/B, W3 363A/B) is narrower than an adjacent drain side width (i.e., W4 364A/B, W5 365A/B).

Figure 4A:
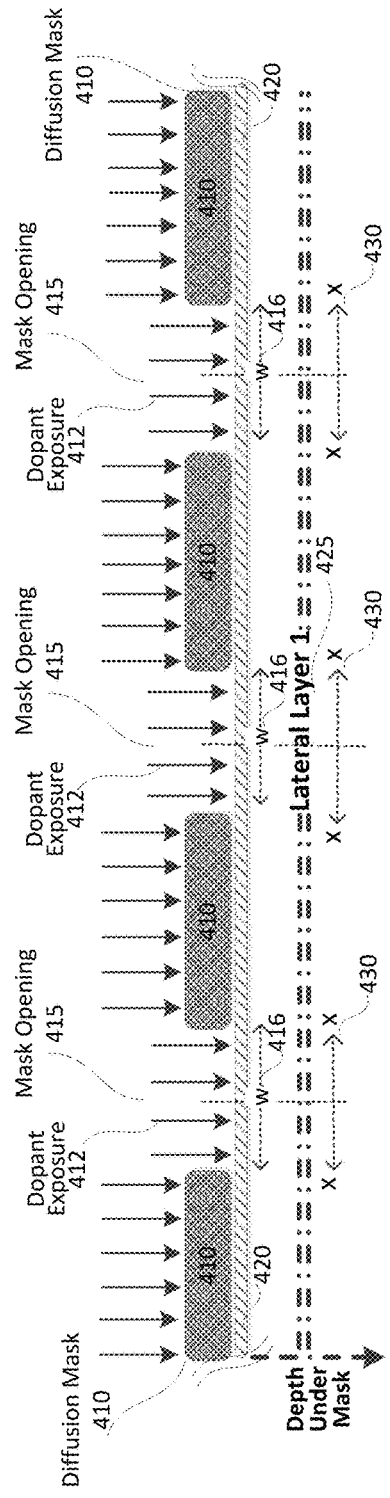
FIG. 4A is an example of vertical cross section of semiconductor block with the mask openings of same width exposed to dopant diffusion (or implantation).
Figure 4B:
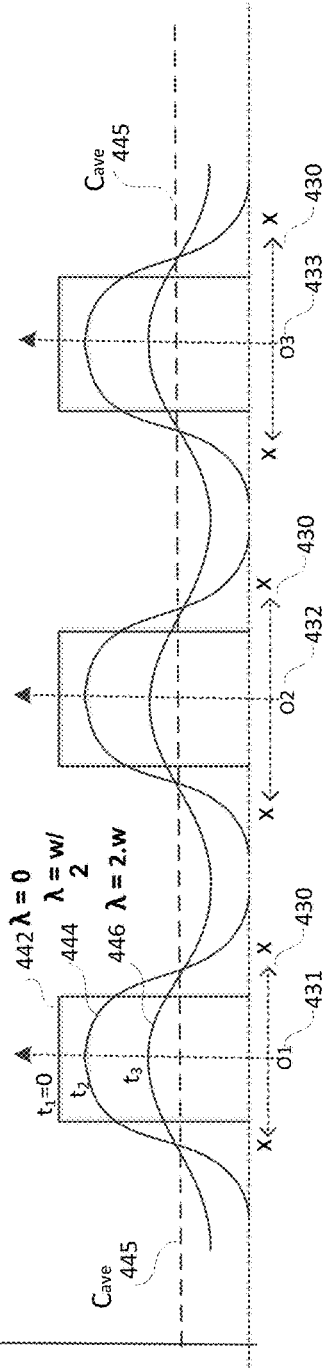
FIG. 4B is an example graph/curves of dopant diffused through the mask openings of FIG. 4A that may expand to the area under the mask and generate a superimpose effect of dopant concentration from all adjacent mask openings.

FIG. 4A and the graphs in FIG. 4B show an example of lateral dopant diffusion through the diffusion mask 410 openings 412, passing through the screen oxide 420, and expansion (blending) of distributed dopant concentration in the lateral layer beneath the surface in different times after exposure to the dopant diffusion. In FIG. 4A the mask openings 415 in the diffusion mask 410 are shown with the same width w 416; however, the mask openings 415 may be of different width as was for example illustrated in FIG. 3A or FIG. 3B. The dopant particles through the surface area with dopant exposure 412 (assumed a width of "w" 416) are transferred and expanded to a lateral layer presented as lateral layer 1 425. It is appreciated that in each conducting lateral layer beneath the mask (surface) the general distribution graph of dopant concentration remains of the same shape, considering that in deeper layers from the surface the dopant concentration weakens (drops) as shown in FIG. 2A.

The graphs in FIG. 4B illustrate concept of dopant diffusion by approximating the dopant lateral diffusion based on time and environmental conditions (e.g., temperature and structure/material of the semiconductor species). As shown, the dopant diffusion/penetration and lateral expansion of the dopant atoms in different lateral directions inside the semiconductor can be defined with respect to a parameter:

$$\lambda = 2\sqrt{D \cdot t} \quad \text{(Equation 1)}$$

where "D" is a Diffusion Coefficient (Constant) and "t" is time after dopant arrives (penetrates) in silicon substrate. The parameter "λ" represents a virtual lateral distance from source of dopant diffusion that the dopant concentration on a Gaussian curve drops to 1/e times of its peak value. The Diffusion Coefficient D for each species is a function of temperature when diffusion processing takes place in an oven or thermal chamber.

The flux J of the dopant particles in lateral direction is defined as a gradient:

$$J = -D \cdot \partial C / \partial x \quad \text{(Equation 2)}$$

where "D" is a Diffusion Coefficient, "C" is the same dopant lateral concentration as discussed in other graphs of this disclosure that represents the number of dopant atoms per unit of lateral length, and "x" is the lateral distance from source of diffusion on the surface.

The rate of change in particle flux in time is defined by the Fick's second law as a divergence:

$$\partial C / \partial t = D \cdot \partial^2 C / \partial x^2 \quad \text{(Equation 3)}$$

A non-limited source of dopant diffusion that could keep a constant concentration $N_0$ on the surface the graph of dopant concentration is introduced by an error complementary function:

$$C(x,t) = C_0 \cdot \text{erfc}[x/2\sqrt{D \cdot t}] = C_0 \cdot \text{erfc}[x/\lambda] \quad \text{(Equation 4)}$$

The error function, erf(x), is represented by:

$$\text{erf}(x) = 2/\sqrt{\pi} \int \exp(-x^2) \cdot dx \quad \text{(Equation 5)}$$

and the complementary error function is defined by:

$$\text{erfc}(x) = [1 - \text{erf}(x)] \quad \text{(Equation 6)}$$

On the other hand for a limited source of dopant diffusion, the surface concentration $C_0$ changes with time:

$$C_0(t) = Q/\sqrt{\pi D \cdot t} \quad \text{(Equation 7)}$$

where "Q" is the total dopant dose of the source. The graph of the dopant concentration is introduced by a Gaussian profile:

$$C(x,t) = C_0(t) \cdot \exp[-(x/2\sqrt{D \cdot t})^2] = C_0(t) \cdot \exp[-(x/\lambda)^2]. \quad \text{(Equation 8)}$$

In the graphs illustrated in FIG. 4B for each diffusion mask opening 415 (with width w 416) in the diffusion mask 410, there is a lateral distribution graph, which for a limited source of diffusion at each time "t" after there is dopant penetration in the semiconductor (e.g., silicon) substrate. In other words, FIG. 4B shows an example Gaussian graph with respect to distance from a center ($o_1$, $o_2$ or $o_3$, 432) of the mask opening 415. The vertical axis 440 represents the dopant concentration at each time after dopant arrival in the substrate (e.g., silicon), and each distance x from a center of the mask opening 415. The first rectangular graph 442 is for time $t_1 = 0$ that results in $\lambda = 0$. The second graph 444 is for a time $t_2$ that presents a parameter $\lambda = 2\sqrt{(D \cdot t_2)} = w/2$. Similarly, the third graph 446 is for a time $t_3$ that presents a parameter $\lambda = 2\sqrt{(D \cdot t_3)} = 2w$.

The dopant diffusion in an elevated temperature process (e.g., in an oven or in a thermal chamber) could make the process faster and with a deeper depth of dopant penetration. For a limited source of dopant diffusion and for a limited finite time of diffusion, or exposure to the dopant source, the periodic variations of the dopant concentration between the diffusion mask openings depends on the pitch distance between the adjacent mask openings. This process explains the periodic variations in distribution of the dopant concentration in graph 465B of FIG. 4C, as indicated with a dashed graph for the 0.8 um stripe width, in comparison to the smooth dopant concentration of graph 465A, as indicated with a solid graph for the 0.5 um stripe width. The finer distribution of the mask openings may result in smoother distribution of the dopant concentration when other conditions remain the same.

Figure 4C:
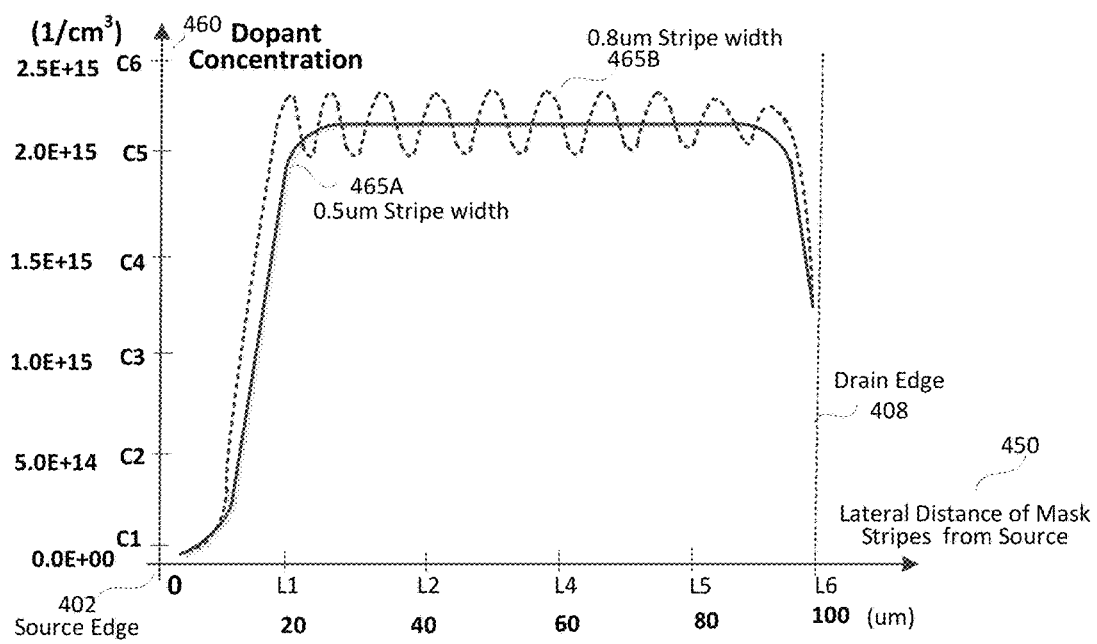
FIG. 4C is a graph of an example uniform doping profile formed using doping mask stripes having two different widths.

FIG. 4C is a graph of an example uniform doping profile formed using doping mask stripes having two different widths. The graph includes a vertical y-axis 460 and a horizontal x-axis 450. The vertical y-axis 460 represents dopant concentration. The horizontal x-axis 450 represents the lateral distance of mask stripes from the source. In the illustrated implementation, the points L1, L2, L3, L4, L5 and L6 along x-axis 450 are associated with corresponding numerical values between 0 and 100 um for purposes of illustration only. Similarly, the values c1, c2, c3, . . . along vertical axis 460 are associated with numerical values of the dopant concentrations between 0.0E00 and 2.0E+15 per cubic centimeter for purposes of illustration only.

The graph of FIG. 4C includes a solid line curve 465A and dashed line curve 465B. Solid line curve 465A represents dopant concentration as a function of lateral distance from the source for 0.5 um-wide diffusion mask stripe openings. Dashed line curve 430B represents dopant concentration as a function of lateral distance from the source for 0.8 um-wide mask stripe openings. For both curves 465A, 465B, the pitch value between the stripes is uniform.

Solid line curve 465A shows a sharp rise in the vicinity of the source edge and a relatively smooth dopant concentration profile along the drift region until the drain edge. The dopant concentration drops in the vicinity of the drain edge. In contrast, dashed curve 465B shows noticeable fluctuations in the dopant concentration along the drift region. However, the of dopant concentration for entire drift region is the same in curve 430A, 465B.

Figure 4D:
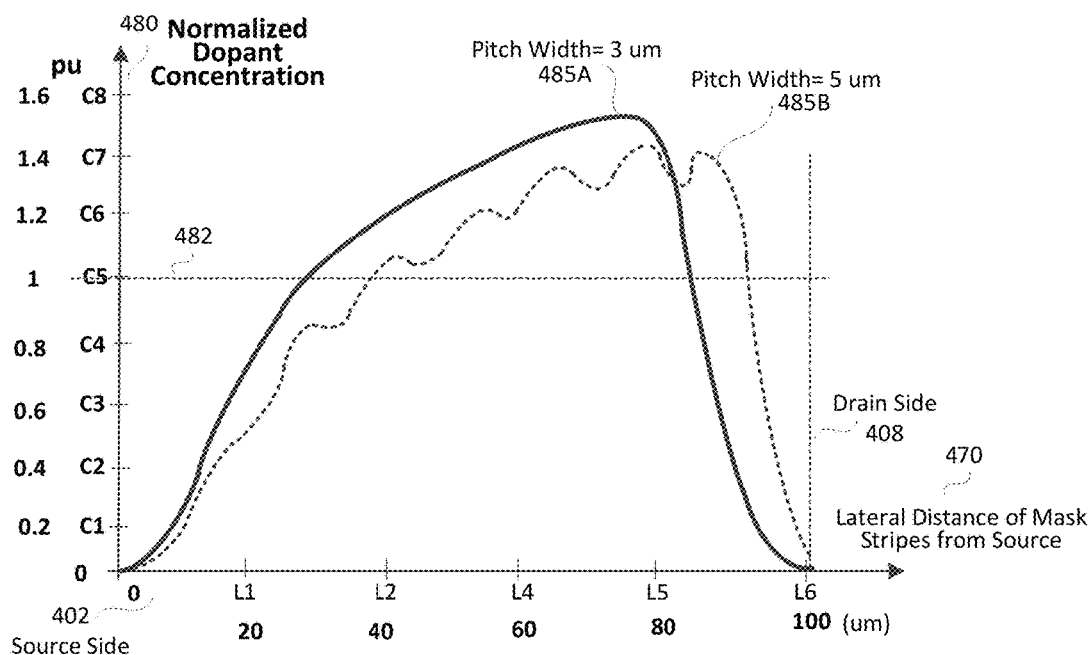
FIG. 4D is a graph for an example laterally-graded doping profile formed using doping mask stripes having different pitches.

FIG. 4D is a graph of an example laterally-graded doping profile formed using doping mask stripes having two different widths. The graph includes a vertical y-axis 480 and a horizontal x-axis 470. The vertical y-axis 480 represents dopant concentration. The horizontal x-axis 470 represents the lateral distance of mask stripes from the source. In the illustrated implementation, the points L1, L2, L3, L4, L5 and L6 along x-axis 470 are associated with corresponding numerical values between 0 and 100 um for purposes of illustration only. Similarly, the values c1, c2, c3, . . . along vertical axis 460 are associated with normalized dimensionless values of dopant concentration "per unit." To arrive at per unit values, the actual dopant concentration at a location is divided by the average dopant concentration of the entire drift region. The numerical per unit values of between 0 and 1.6 per unit are included for purposes of illustration only.

The graph of FIG. 4D includes a solid line curve 485A and dashed line curve 485B. Solid line curve 485A represents dopant concentration as a function of lateral distance from the source for 3 um of pitch width between mask stripe openings. Dashed line curve 485B represents dopant concentration as a function of lateral distance from the source for 5 um of pitch width between mask stripe openings.

Solid line curve 485A shows a non-linear but nearly continuous rise from relatively low per unit values in the vicinity of the source edge to relatively higher per unit values for the majority of the drift region. However, in the vicinity of the source, solid line curve 485A returns to the relatively low per unit values. In contrast, dashed curve 485B shows noticeable fluctuations in the dopant concentration profile along the drift region. However, the average dopant concentration in the entire drift region is the same for both curves 485A, 485B.

Figure 5A:
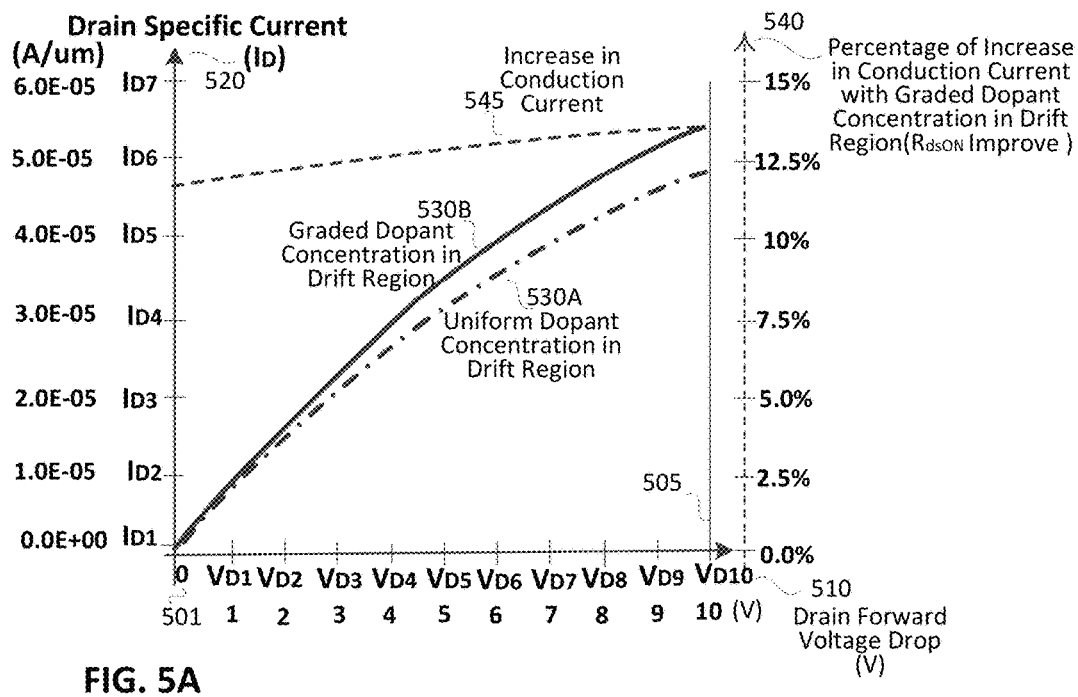
FIG. 5A is a V-I graph of drain conduction current versus the drain voltage drop. The characteristic Volt-Ampere, V-I graph in the on-state (that presents the on-resistance, $R_{dson}$) of a device/transistor with graded distribution of dopant in the drift region is compared with a similarly-sized transistor with a uniform dopant distribution.

FIG. 5A is a V-I (Volt-Ampere) graph of drain conduction current versus the drain voltage drop in the on-state for both a transistor that includes a graded dopant concentration in the drift region and a similarly-sized transistor with a uniform dopant distribution in the drift region. Such V-I graphs illustrate the drain forward voltage drop due to the device on-resistance when the drain current passes through the device.

The graph in FIG. 5A includes a horizontal x-axis 510 and a vertical y-axis 520. The horizontal x-axis 510 represents the drain voltage while in the on-state. In the illustrated range, drain voltage ranges between zero 501 and $V_{D10}$. In the illustrated implementation, the points $V_{D1}$, $V_{D2}$, . . . and $V_{D10}$ along x-axis 510 are associated with corresponding numerical values between 0 and 10V for purposes of illustration only. The vertical y-axis 520 represents the specific drain current in units of amperes per micrometer (A/um). In the illustrated implementation, the points $I_{D1}$, $I_{D2}$, . . . , $I_{D7}$ along vertical y-axis 520 are associated with corresponding numerical values between 0.0E+00 to 6.0E+−05 Alum for purposes of illustration only.

The graph in FIG. 5A also includes a collection of curves 530A, 530B, and 545. Curve 530A represents the volt-Ampere (V-I) characteristics of a device with uniform dopant concentration along the drift region while in the on-state. Curve 530B represents the volt-Ampere (V-I) characteristics of a device with a laterally-graded dopant concentration in drift region. The devices are of a similar size.

As shown, for each value of the forward voltage drop along the x-axis, the conduction current through the device with a laterally-graded dopant concentration (530B) has a higher value than the conduction current through the device with a uniform dopant concentration (530A). In other words, for the entire range of drain current values, the forward voltage drop of the device with the laterally-graded doping (530B) is less than the forward voltage drop of the device with a uniform dopant concentration (530A). This translates into a lower on-resistance and an improved performance of the device with the laterally-graded dopant concentration.

In FIG. 5A, the increase in conduction current for the device with a laterally-graded dopant concentration is illustrated by the dashed line 545. The percentage increase in the conduction current is shown on the dashed vertical axis 540 on the right. The increased conduction current of the device results from the improved on-resistance ($R_{dsoN}$) of the device. For the example numerical values of drain forward voltage drop along axis 510, a maximum increase in conduction current of around 13.5% can be observed. This increase in conduction current corresponds to a decrease in on-resistance of 88% of the device with the graded dopant concentration relative to a similarly-sized device with a uniform dopant concentration in the drift region.

Figure 5B:
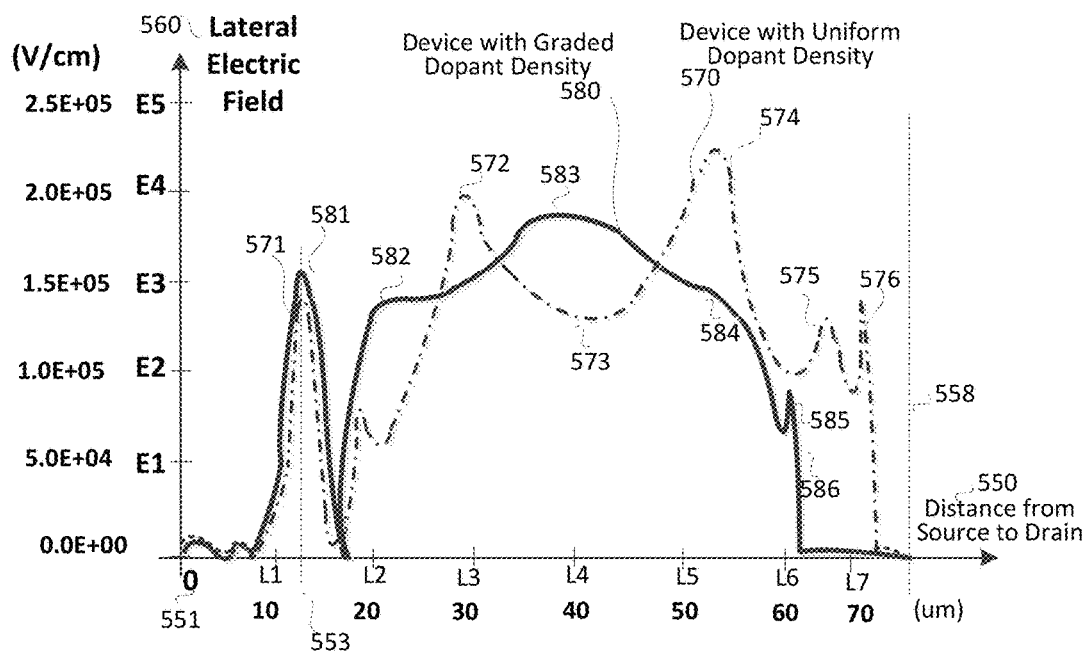
FIG. 5B is a schematic illustration of the lateral electric field distribution versus the distance from source to drain.

FIG. 5B is a schematic illustration of the lateral electric field distribution versus the distance from source to drain. This graph illustrates that a device with a laterally-graded dopant concentration in the drift region provides a more uniform distribution of lateral electric field (V/cm) between the source and the drain relative to a device with a uniform dopant distribution in the drift region.

In FIG. 5B includes a horizontal x-axis 550 and a vertical y-axis 560. The horizontal x-axis 550 represents the lateral distance from a source at zero distance 551 in the direction of a drain edge 558. In the illustrated implementation, the points L1, L2, L3, . . . L7 along horizontal x-axis 550 are associated with corresponding numerical values given in micrometers, um, that show a total drain to source length $L_{DS}$ of approximately 80 micrometers. This length and the particular numerical values are for purposes of illustration only. In this regard, the length of drift region defines the device rating and in one example could be around 60-70 um. The zero distance 551 presents the source edge and the drain edge is presented by the right hand side line 558.

The vertical y-axis 560 represents the lateral electric field. In the illustrated implementation, the points E1, E2, . . . E5 along vertical y-axis 560 are associated with example numerical values of electric field given in Volt per centimeter (V/cm) for purposes of illustration only.

The graph in FIG. 5B includes a solid line curve 580 and a dash-dot curve 570. Solid line graph 580 shows the lateral distribution of electric field between source and drain for a device with a graded dopant concentration in the drift region. Dash-dot graph of 570 shows the lateral distribution of electric field between source and drain for a device with a uniform concentration of dopant in the drift region. For both curves 570, 580, in the vicinity of the source (i.e., in the vicinity of zero position 551), the electric field is relatively low. In the vicinity of a gate edge at 553, the electric field rises to a respective local maximum 571, 581. However, further from the source and past the gate towards the drain (i.e., along the drift region), the device that has a uniform dopant concentration (dash-dot graph 570) shows multiple peaks and valleys (e.g., 572, 573, and 574) whereas the device with a laterally-graded dopant concentration (solid graph 580) has a relatively more uniform electric field. Even though the device with a laterally-graded dopant concentration may still show some local fluctuations of the electric field profile in the drift region (e.g., 582, 583, and 584), the electric field distribution shows no dominant peaks. The rather flat electric field distribution reduces the risk of local breakdowns when a high voltage is applied to the drain in the off-state.

A comparison of curve 580 for the device with a laterally-graded dopant concentration with curve 570 for the device with uniform dopant concentration in the vicinity of the drain also confirms that the high dopant concentration pattern around the drain can reduce the local electric field. This results in a smaller and hence safer drop of electric field at the drain edge 558, as shown.

Figure 6:
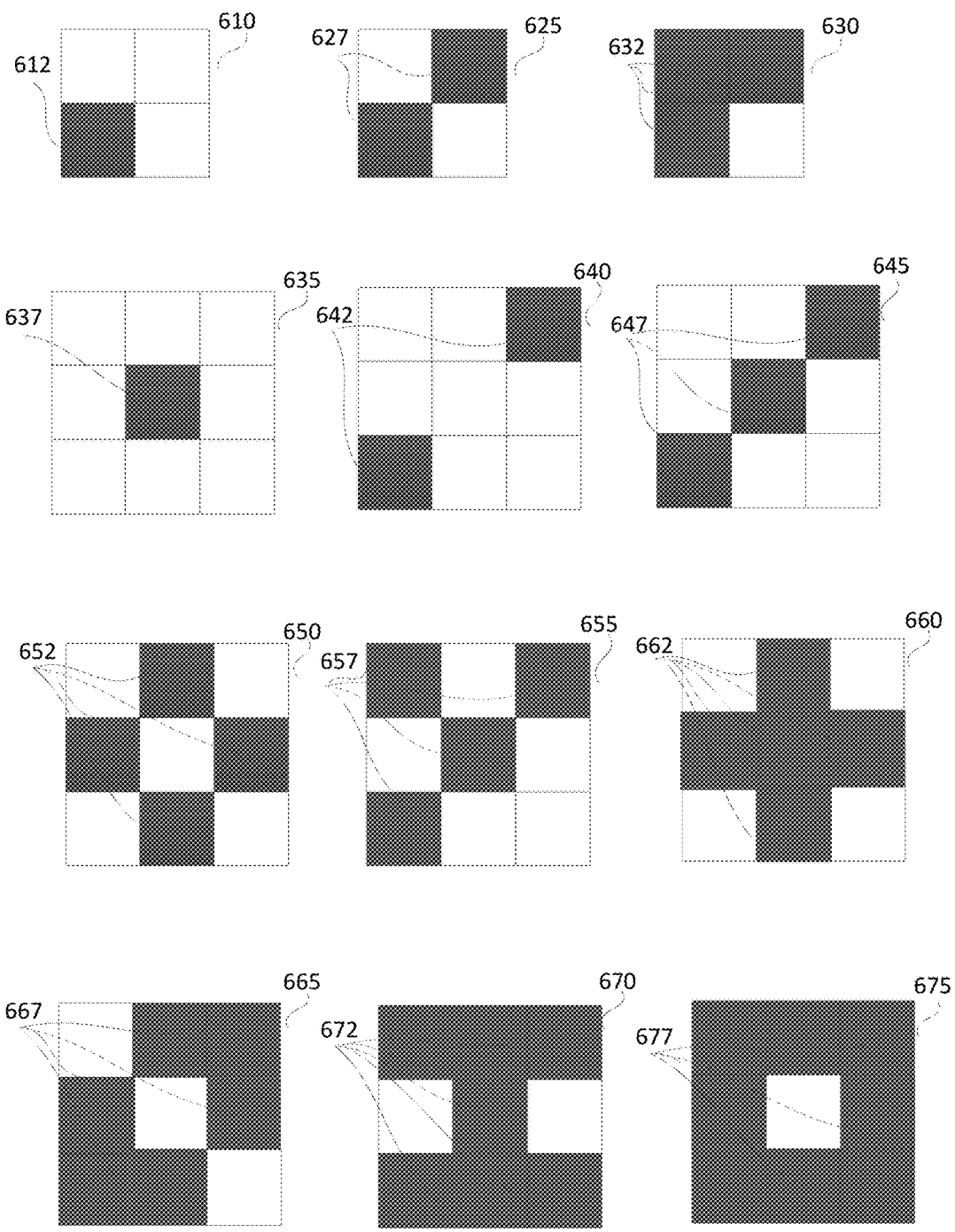
FIG. 6 is a schematic illustration of example matrix cells in accordance with a halftoning technique.
Figure 7A:
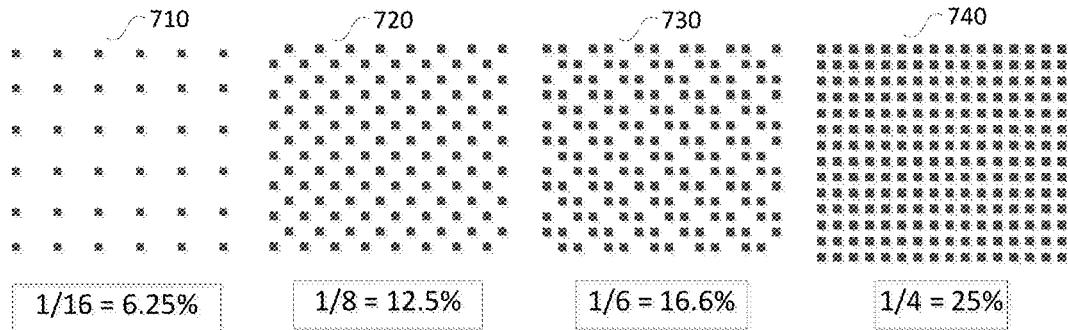
FIG. 7A is a schematic illustration of example groups of matrix cells.
Figure 7B:
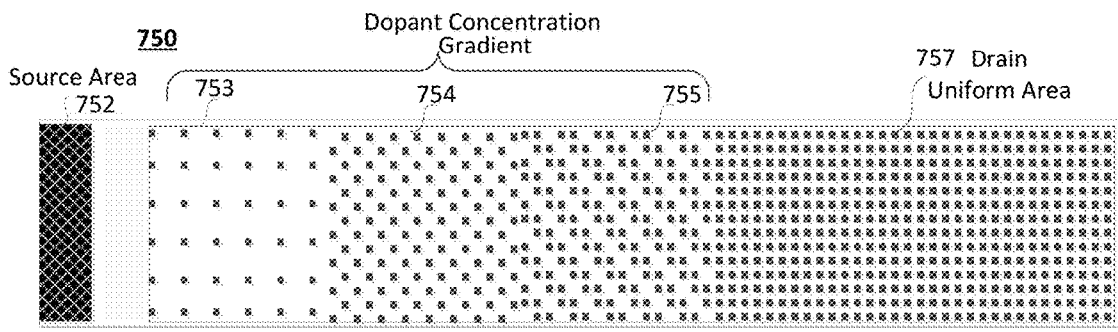
FIG. 7B presents an example profile of Drift region graded doping utilizing the sample halftone masks in FIG. 6. It shows the doping gradient from drain to source.
Figure 7B:
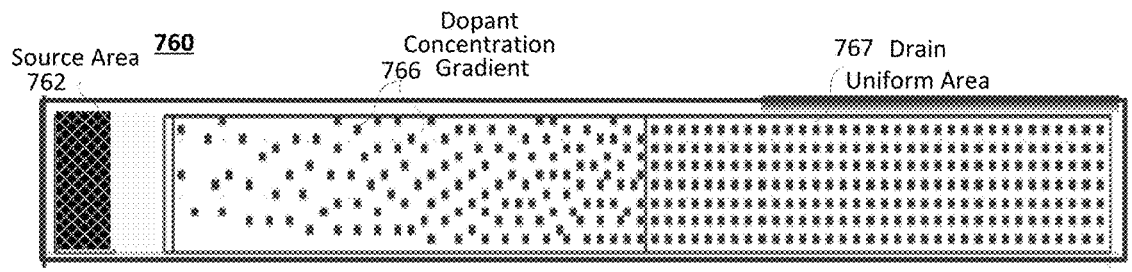
Figure 7B:
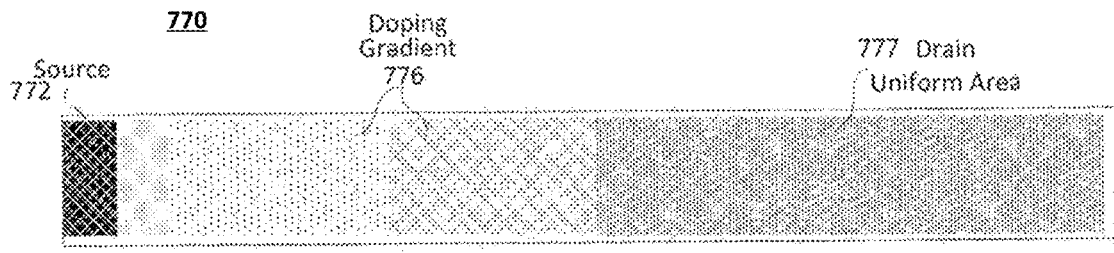
Figure 8:
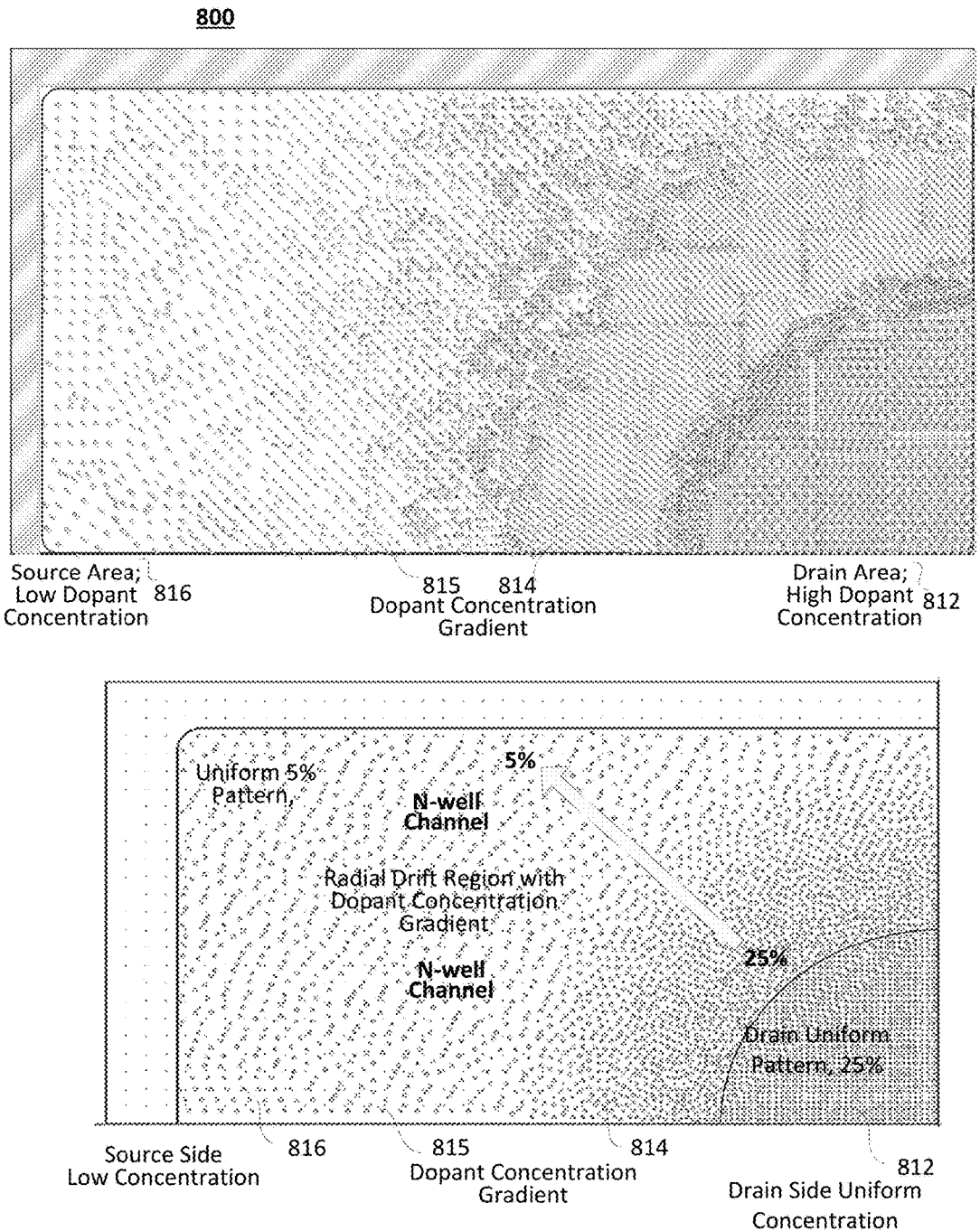
FIG. 8 is a schematic illustration of a lateral two-dimensional view of a drain-tip cell with laterally-graded doping formed using a halftone technique with a radial-linear gradient in combination with uniform concentration regions (around the drain).

As will be discussed, an example utilizing a halftoning technique for the production of a diffusion doping mask is illustrated in FIGS. 6-8. The halftoning example provides an advantage of very fine finite elements of diffusion mask openings that utilize a variety of different matrix patterns on the diffusion doping mask. This example process provides the mask opening arrangements that could be utilized for either a uniform or a graded dopant distribution in the drift region. For instance, in one example, a plurality of discrete portions of a surface as surface elements having at least one of a laterally-varying size, a laterally-varying shape, and a laterally-varying spacing is defined on a surface of a material. A plurality of portions of the material beneath the surface elements may then be doped with a single quantity of dopant material per element area. The dopant materials may then expand within the material beneath the surface after being doped to provide a lateral gradient of dopant material in the material beneath the surface. It is appreciated that the plurality of discrete portions of the surface may apply to at least one of a plurality of surface stripes or a plurality of surface matrix cells. The plurality of surface stripes or surface matrix cells may be defined with openings in an ion beam implantation mask or diffusion mask disposed over the plurality of discrete portions of the surface. The doping of the plurality of portions of the material may be realized by implanting or diffusing the dopant material through the openings with a dopant beam or an ion beam to penetrate and implant the dopant into the material. The openings therefore define the surface elements onto which said one of a dopant beam or an ion beam to penetrate the surface of the material and implant the dopant material such that the ion beam implantation mask or the diffusion mask screen the dopant beam or the ion beam.

Thus, for devices that are designed to provide advanced performance, the graded dopant concentration in the drift region provided with a halftoning technique in accordance with the teachings of the present invention may help provide a smooth blended gradient of dopant distribution in drift region. In one example, the matrix pattern that is generated to provide the fine mask openings utilized in the discussed halftoning technique is provided digitally with computer software.

To illustrate, FIG. 6 is a schematic illustration of example matrix cells arranged in accordance with a halftoning technique in accordance with the teachings of the present invention. In the depicted example, halftoning is a technique in which relatively small discrete portions of a surface are imbued with a single "tone" (i.e., a single color or a single shade) to simulate a relatively larger image that has a multiple tones or even a continuous tone. The discrete portions are generally squares, but dots, triangles, and/or other geometric shapes can also be used. By laterally varying one or more of the size of the discrete portions, the shape of the discrete portions, and the spacing between the discrete portions, a lateral gradient effect is created as the discrete, single tone portions appear as larger regions having multiple tones or a continuous tone.

In the "halftoning" doping described herein, discrete portions of a surface can be defined, e.g., by relatively small openings in an implantation, diffusion, or other mask and/or beam focusing. A single dopant "tone"—or quantity of dopant material per unit area—traverses the surface of the portions to directly dope in the underlying material. It is appreciated that, as described in FIGS. 4A-4B, there will be some lateral blending or superimposing of dopant diffusion out of the directly-doped portions for the adjacent mask openings and the dopant concentration at each point is the superimposed effect of the dopant diffusion from all adjacent mask openings. By an optimum design of the doping mask matrix pattern, the dopant concentration could be controlled for a uniform or a desired gradient of dopant concentration in the drift region of device. The size, shape or the spacing of the mask openings, which provide directly-doped portions, could be varied laterally so that a lateral continuous or non-continuous gradient effect is created.

Because the lateral gradient effects occur over relatively large areas and include multiple doped portions, the dopant concentrations provided herein included superimposed effects of dopant concentrations from adjacent mask openings, and are effectively averaged or blended over each superimposed areas. Continuous or non-continuous lateral gradient effects thus occur over relatively large areas relative to the size of both the doped portions and the lateral diffusion of dopant out of those portions. These areas necessarily include multiple doped portions. In other words, the granularity of individual doped portions is ignored for a given area. Instead, the superimposed effect of dopant concentration over an area that includes multiple dopant portions is provided.

In general, the spacing between doped portions in a continuous or non-continuous laterally-graded area will be on the order of the size of the doped portions themselves. For example, as described further below, a 6.25% dopant concentration that is superimposed over a surrounding area can be achieved with uniform, square-doped portions that are separated from their nearest neighbor by a distance that is about four times the length of the sides of the square doped portions. A 25% dopant concentration can be achieved with uniform, square-doped portions that are separated from their nearest neighbor by a distance that is about twice the length of the sides of the square doped portions. It is of course possible to calculate similar relationships between area-averaged dopant concentration and the spacing between doped portions for, e.g., doped portions of different geometries and uniformities.

It is noted that these percentage dopant concentrations—and indeed all percentage dopant concentrations described herein—are approximate only. In this regard, although the area that is directly doped by material traversing an overlying surface can be calculated precisely, such dopant will generally diffuse to some extent laterally away from the directly-doped area. The extent and impact of such lateral diffusion is a function of several parameters, including the nature of the dopant and substrate materials, processing conditions, and time. Accordingly, the percentage dopant concentrations described hereinafter do not account for lateral diffusion and are approximate only.

In FIG. 6, examples of some possible fractions of dopant concentration are illustrated by matrices of 2×2 or 3×3 cells. The black cells represent the doped areas where dopant can cross a surface of the substrate by diffusion, implantation, and/or beam focusing. The matrices can thus in some implementations correspond to areas on diffusion masks or implantation masks. In one example, different variation of dopant concentration along the drift region can be generated by a matrix mask with selective open cells to diffuse the dopant into the surface. For example, diffusion and implantation masks having ten or more such matrices, e.g., 100 or more such matrices, or thousands of such matrices can be created.

A 2×2 matrix 610 has one open cell 612 and may be used to create a local 25% dopant concentration over the area of the matrix. The two open cells 627 in the 2×2 matrix 625 can be used to create a local 50% dopant concentration over the area of the matrix. Three open cells 632 of the 2×2 matrix 630 can be used to create a local dopant concentration of 75% over the area of the matrix.

The 3×3 matrix 635 has one open cell 637, 3×3 matrix 640 has two open cells 642, 3×3 matrix 645 has three open cells 647, 3×3 matrices 650, 655 each have four open cells 652 or 657, 3×3 matrix 660 has five open cells 662, 3×3 matrix 665 has six open cells 667, 3×3 matrix 670 has seven open cells 672, and 3×3 matrix 675 has eight open cells 677. These matrices can be used to create local dopant concentrations of 11.1%, 22.2%, 33.3%, 44.4%, 55.5%, 66.6%, 77.7%, and 88.8% over the area of their respective matrices.

By utilizing larger sized matrices and/or more complicated matrix structures, additional varieties of dopant concentration and finer steps in the dopant concentration variation can be achieved. Further, when large numbers of such matrices are arranged adjacent one another on a surface, large regions having multiple tones or even approximating a continuous tone can be formed in a drift region or other substrate.

FIG. 7A is a schematic illustration of example groups 710, 720, 730, 740 of matrix cells that are arranged in accordance with a halftoning technique. Each group 710, 720, 730, 740 in FIG. 7A exclusively includes matrix cells having the same local dopant concentration. Thus, each group 710, 720, 730, 740 has the same dopant concentration averaged over the area covered by the group as dopant concentration over the area of the group's constituent matrices. In the illustrated implementations, the dopant concentration over the area of the group's constituent matrices ranges from around 6% to 25%. This is not necessarily the case as other dopant concentrations can be achieved with different matrices.

In the illustrated implementation, the matrix cells in each group are identical and arranged identically. This is not necessarily the case. For example, identical matrices that are rotated, or different matrices having identical locally averaged dopant concentrations, such as for example matrices 650 and 655 of FIG. 6, can be included in a group and the resultant group will still have the same dopant concentration over the area covered by the group.

In FIG. 7A, matrix group 710 includes 36 identical 4×4 matrices having a single open cell. As a result, both matrix group 710 and its constituent 4×4 matrices have a dopant concentration of 1/16=6.25%. Matrix group 720 includes identical 4×4 matrices each having two open cells. As a result, both matrix group 740 and its constituent 4×4 matrices have a dopant concentration of 1/8=12.5%. Matrix group 730 includes identical 2×3 matrices each having two open cells. As a result, both matrix group 730 and its constituent 2×3 matrices have a dopant concentration of 1/6=16.6%. Matrix group 740 includes identical 2×2 matrices each having a single open cell. As a result, both matrix group 760 and its constituent 2×2 matrices have a dopant concentration of 1/4=25%.

These example matrix groups can be used, e.g., in the drift region structure of a lateral device with graded dopant concentration as depicted in FIG. 7B. In one example, the graded doping profile of FIG. 7A can be used for a MOSFET device in which the original PBURIED and Drift region features are replaced by a halftone gradient. In the example, the drain region 767 has a uniform 25% halftone concentration. However, within the drift region, surrounding the drain, the halftone pattern decreases radially in a linear gradient down to 5% at a radius distance corresponding to the source area 762 location. In the drift region beyond this radial distance of source location the gradient of doping concentration remains uniform at 5% concentration of halftone pattern. This extended area of 5% uniform concentration allows relaxation of the electric field at the drain tip and may provide an easy connection of drain to the other pads/terminals.

Schematic in FIG. 7B illustrates example halftoned substrates having dopant densities that are laterally-graded in a single dimension, i.e., between the left and right hand side of the page. In particular, the substrates are portions of semiconductor devices 750, 760 and 770 that each includes a respective source area (752, 762 or 772) and drain area (757, 767 or 777) separated by a channel and drift-region (753-755, 766 or 776) that has a laterally-graded dopant concentration.

In first example device 750 the channel and drift-region (753-755) include four different half-toned regions 753, 754, 755, 757. Each region 753, 754, 755, 757 includes a group of identical matrices having the same orientation. The local dopant concentration within each individual region 753, 754, 755, 757 is uniform although the dopant concentration of the device in the entire drift region remains laterally graded. In other words, the dopant concentration is laterally graded on a larger dimensional scale (e.g., the dimensional scale of the separation between the source area and the drain area) notwithstanding the uniform local average dopant concentration within each region 753, 754, 755, 757.

In the illustrated implementation, region 753 is closest of three to the source area and has the lowest local dopant concentration. For example, region 753 can be covered in its entirety by matrix group 710 of FIG. 7A, and have a local dopant concentration of around 6%. Region 754 is disposed on the drain-side of region 753 and has a higher local dopant concentration than region 753. For example, region 754 can be covered in its entirety by matrix group 720 of FIG. 7A, and have a local dopant concentration of 12.5%. Region 755 is disposed on the drain-side of region 754 and has a higher local dopant concentration than region 754. For example, region 755 can be covered in its entirety by matrix group 730 of FIG. 7A, and have a local dopant concentration of 16.6%.

Region 757 is disposed on the drain-side of region 755 and has a higher local dopant concentration than region 755. For example, region 757 can be covered in its entirety by matrix group 740 of FIG. 7A, and have a local dopant concentration of 25%. In general, region 757 will have a larger area than regions 753, 754, 755. The larger area and relatively higher local dopant concentration of region 757 provides a relatively lower electric field around the drain.

In the second example device 760, the channel and drift-region includes halftoned regions 766 and 767. Region 766 includes a variety of different matrices in different orientations. Within region 766, matrices that are closer to source area 762 have lower local dopant concentrations. Matrices that are closer to the drain area have higher local dopant concentrations. Matrices that are disposed close to the middle of channel and drift-region have intermediate dopant concentrations. Individual matrices are disposed to achieve a lateral gradient that approximates a nearly continuous gradient. Region 766 thus comes closer to achieving the idealized continuous behavior of dopant concentration in FIGS. 5A-5B, which were calculated using ideally continuous lateral gradients.

Region 767 is disposed on the drain-side of region 766 and has a higher local dopant concentration than region 766. For example, region 767 can be covered in its entirety by matrix group 740 of FIG. 7A, and have a dopant concentration of 25%.

In the third example device 770, the channel and drift-region 776 includes different halftoned regions 776. The local dopant concentration within each individual region is uniform although the dopant concentration in drift region of the device remains laterally graded.

In the drift region of device by making the widths of regional sections (i.e., 753/754/755/757 or 766/767) smaller, the dimensional scale over which the local average dopant concentration is laterally graded is smaller and it results in a closer approximation of the idealized continuous behavior of FIGS. 5A-5B.

FIG. 8 is a schematic illustration of example device 800 halftoned substrates having dopant concentrations that are laterally-graded in two lateral dimensions, i.e., between the left and right hand side of the page and between the top and the bottom of the page. Such lateral grading in two lateral dimensions is needed, e.g., in the drain fingertip region of a lateral semiconductor device. The illustrated substrates are channel and drift-regions 812, 814, 816 of semiconductor device 800. Channel and drift-regions extend from a respective source side 816 to a drain side 812.

In examples of FIG. 8, a laterally-graded dopant concentration or a doping gradient 814/815 in the channel and drift-region is achieved with multiple groups of identical matrices having the same orientation. The groups of identical matrices are not necessarily the same size, nor does each group necessarily occupy the same surface area. Instead, non-uniformly-shaped groups of identical matrices can be arranged to achieve desired lateral gradient.

Within channel and drift-region there may be discrete regions of identical matrices that have the same orientation. However, the channel and drift-region may also include a variety of different matrices in different orientations. Individual matrices are disposed to achieve a lateral gradient that approximates a nearly continuous gradient over the drift region of device.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method comprising:
    defining, with a masking layer formed on a surface of a material, a plurality of discrete portions of a surface as surface elements, wherein the surface elements are arranged into a plurality of surface matrix cells having a laterally-varying density of open cells in accordance with a halftone gradient, and wherein the plurality of surface matrix cells are arranged in accordance with the halftone gradient into a plurality of halftone regions, wherein each region in the plurality of halftone regions has a different density of the open cells in the plurality of surface matrix cells, wherein a first region in the plurality of halftone regions has a first density of the open cells, a second region in the plurality of halftone regions has a second density of the open cells, and a third region in the plurality of halftone regions has a third density of the open cells, and wherein the first density is greater than the second density, and the second density is greater than the third density;
    doping a plurality of portions of the material beneath the surface elements with a single quantity of dopant material per element area; and
    expanding the dopant material within the material beneath the surface to provide a lateral gradient of dopant material in the material beneath the surface; and
    forming a source electrode and a drain electrode on the material to create a semiconductor device, wherein the material is a semiconductor material, and wherein a local dopant concentration proximate to the drain electrode of the semiconductor device is greater than a local dopant concentration proximate to the source electrode of the semiconductor device, and wherein the first region is disposed proximate to the drain electrode, and the third region is disposed proximate to the source electrode, and the second region is disposed between the first region and the third region.

2. The method of claim 1 wherein the masking layer includes at least one of an ion beam implantation mask or a diffusion mask, and wherein said doping of the plurality of portions of the material comprises one of implanting or diffusing the dopant material through the open cells.

3. The method of claim 2 wherein said open cells define the surface elements onto which said one of a dopant beam or an ion beam to penetrate the surface of the material and implant the dopant material, and wherein said one of the ion beam implantation mask or the diffusion mask screen said one of the dopant beam or the ion beam.

4. The method of claim 1 wherein the semiconductor material comprises one of p type semiconductor material or n type semiconductor material.

5. The method of claim 4 wherein the dopant material comprises one of p type dopant material or n type dopant material.

6. The method of claim 5 wherein a quantity of dopant material varies along a lateral channel of the semiconductor device.

7. The method of claim 6 wherein said doping the plurality of portions of the material beneath the surface elements form a plurality of doped regions of the semiconductor device.

8. The method of claim 7 wherein a quantity of the dopant material in each one of the plurality of doped regions in the lateral channel is defined by a local dopant concentration in said one of the plurality of doped regions.

9. The method of claim 8 wherein the plurality of doped regions in the lateral channel is formed between a source electrode and a drain electrode of the semiconductor device.

10. The method of claim 9 wherein the local dopant concentration proximate to the drain electrode of the semiconductor device forms a uniform concentration region, and wherein the local dopant concentration proximate to the source electrode of the semiconductor device is reduced with respect to the local dopant concentration proximate to the drain electrode by a radial gradient of dopant towards the source electrode.

11. The method of claim 10 wherein the semiconductor device is a high voltage switching device, wherein around 25% of an area proximate to the drain electrode is exposed to the doping material and around 5% of an area proximate to the source electrode is exposed to the doping material.

12. The method of claim 1, wherein a density of the open cells in the plurality of surface matrix cells decreases radially from the drain to the source electrode.

13. The method of claim 1, further comprising a fourth region in the plurality of halftone regions that has a fourth density of the open cells, and wherein the fourth region is laterally disposed between the third region and the second region, and wherein the fourth density is less than the second density and greater than the third density.

* * * * *